(12) United States Patent
Schubert et al.

(10) Patent No.: US 9,997,662 B2
(45) Date of Patent: Jun. 12, 2018

(54) LIGHT-EMITTING METAL-OXIDE-SEMICONDUCTOR DEVICES AND ASSOCIATED SYSTEMS, DEVICES, AND METHODS

(71) Applicant: Micron Technology, Inc., Boise, ID (US)

(72) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 15/249,140

(22) Filed: Aug. 26, 2016

(65) Prior Publication Data

US 2017/0047474 A1     Feb. 16, 2017

Related U.S. Application Data

(62) Division of application No. 13/918,655, filed on Jun. 14, 2013, now Pat. No. 9,433,040.

(51) Int. Cl.

| | | |
|---|---|---|
| *H05B 43/00* | (2006.01) | |
| *H01L 33/00* | (2010.01) | |
| *H05B 33/08* | (2006.01) | |
| *H01L 27/15* | (2006.01) | |
| *H01L 33/06* | (2010.01) | |
| *H01L 33/32* | (2010.01) | |
| *H01L 33/38* | (2010.01) | |
| *F21Y 115/10* | (2016.01) | |
| *F21V 23/00* | (2015.01) | |

(52) U.S. Cl.
CPC .......... *H01L 33/0041* (2013.01); *H01L 27/15* (2013.01); *H01L 33/06* (2013.01); *H01L 33/32* (2013.01); *H01L 33/38* (2013.01); *H05B 33/08* (2013.01); *F21V 23/003* (2013.01); *F21Y 2115/10* (2016.08)

(58) Field of Classification Search
CPC . H01L 27/1214; H01L 27/12; H01L 27/0688; H01L 27/11; H01L 27/10841; H01L 29/66757; H01L 28/40; H05B 41/34; H05B 33/0803; H05B 33/0809; H05B 41/2325; H05B 41/28
See application file for complete search history.

(56) References Cited

U.S. PATENT DOCUMENTS

| | | | |
|---|---|---|---|
| 8,362,514 B2 | 1/2013 | Hwang | |
| 2008/0083969 A1* | 4/2008 | Osada | H02M 7/06 257/595 |
| 2011/0108869 A1* | 5/2011 | Hwang | H01L 27/15 257/98 |

(Continued)

*Primary Examiner* — Minh D A
(74) *Attorney, Agent, or Firm* — Perkins Coie LLP

(57) ABSTRACT

Various embodiments of solid state transducer ("SST") devices are disclosed. In several embodiments, a light emitter device includes a metal-oxide-semiconductor (MOS) capacitor, an active region operably coupled to the MOS capacitor, and a bulk semiconductor material operably coupled to the active region. The active region can include at least one quantum well configured to store first charge carriers under a first bias. The bulk semiconductor material is arranged to provide second charge carriers to the active region under the second bias such that the active region emits UV light.

18 Claims, 10 Drawing Sheets

(56) References Cited

U.S. PATENT DOCUMENTS

| | | | |
|---|---|---|---|
| 2011/0248300 A1* | 10/2011 | Hwang | H01L 27/15 257/98 |
| 2012/0313589 A1 | 12/2012 | Holme et al. | |
| 2014/0368123 A1 | 12/2014 | Odnoblyudov et al. | |

* cited by examiner

LIGHT-EMITTING METAL-OXIDE-SEMICONDUCTOR DEVICES AND ASSOCIATED SYSTEMS, DEVICES, AND METHODS

CROSS-REFERENCE TO RELATED APPLICATION(S)

This application is a divisional of U.S. patent application Ser. No. 13/918,655, filed Jun. 14, 2013, now U.S. Pat. No. 9,433,040, which is incorporated herein by reference.

TECHNICAL FIELD

The present disclosure is related to electrical contacts in light emitting semiconductor devices, such as light emitting diodes ("LEDs") and other solid state transducer ("SST") devices.

BACKGROUND

SST devices can have light emitting dies with different electrode configurations. For example, FIG. 1 is a cross-sectional view of a light emitting device 100. As shown, the light emitting device 100 includes a substrate 101 carrying an LED structure 102 comprised of N-type gallium nitride (GaN) 104, one or more GaN/indium gallium nitride (InGaN) quantum wells (QWs) 105, and P-type GaN 106. The light emitting device 100 also includes a first electrode 108 on the N-type GaN 104 and a second electrode 109 on the P-type GaN 106. In operation, a voltage applied across the electrodes generates electron/hole pairs in the active regions of the LED structure 102. When these pairs recombine, energy is released, including energy in the form of emitted light. In general, the wavelength of the emitted light is based on the energy difference between the electrons and holes before they recombine.

DETAILED DESCRIPTION

Various embodiments of light emitting devices, SST systems with light emitters, and associated methods are described below. As used hereinafter, the term "light emitter" generally refers to devices with one or more solid state light emitting devices, dies, and/or substrates, such as LEDs, laser diodes ("LDs"), and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 2-10.

Conventional ultraviolet (UV) light emitters typically employ arrangements of GaN and aluminum GaN (AlGaN) materials. The AlGaN materials, in particular, can have alloyed/engineered concentrations of aluminum, N-type dopant, and P-type dopant to achieve a certain UV wavelength and/or spectrum of wavelengths. In operation, N-type and P-type AlGaN at least partially define a quantum well, with the P-type AlGaN configured to inject P-type charge carriers (i.e., holes) into the quantum well. One problem, however, with P-type AlGaN is that it has low conductivity and low light extraction efficiency. The conductivity is low because the acceptor species (e.g., magnesium (Mg)) has a high activation energy. The light extraction efficiency is low because P-type AlGaN is not compatible with the highly reflective materials ordinarily available for Ohmic connections in (non-UV) light emitters As a result, conventional UV light emitters can have operational efficiencies that are less than 5%. Embodiments of the present technology, however, address these and other limitations of conventional UV light emitters and other conventional emitters.

Figure 1:
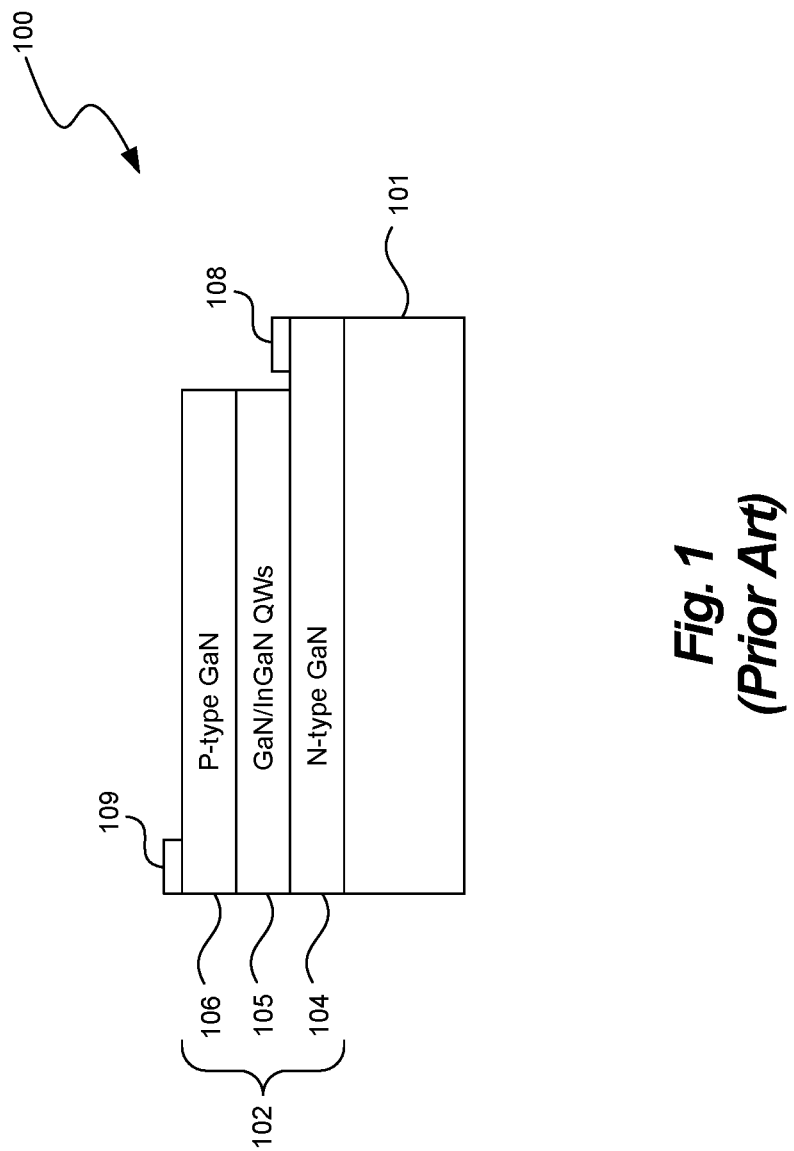
FIG. 1 is a schematic cross-sectional view of a light emitting device configured in accordance with the prior art.
Figure 2:
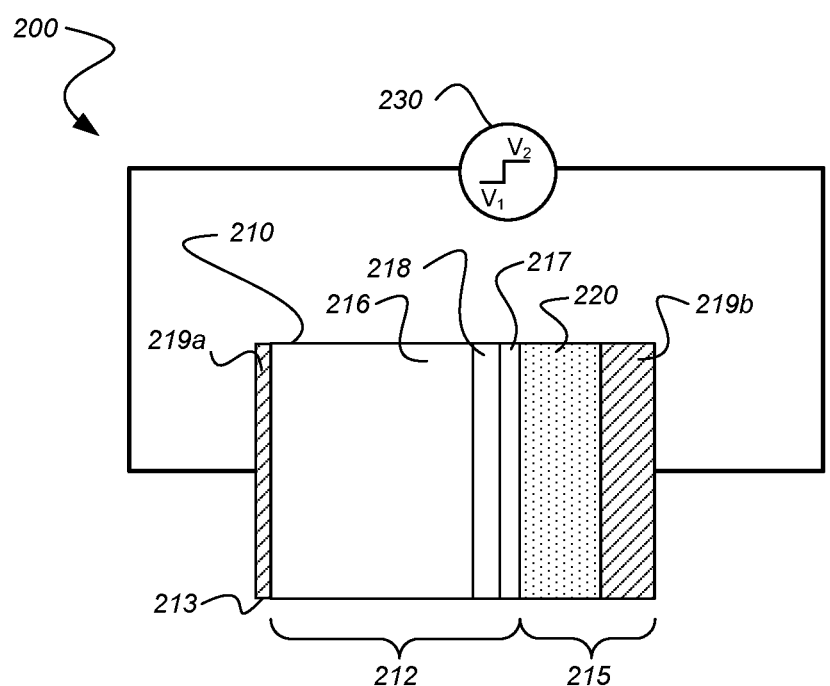
FIG. 2 is a schematic cross-sectional diagram of an SST system having a light emitter and a waveform generator configured in accordance with an embodiment of the present technology.

FIG. 2 is a schematic cross-sectional diagram of an SST system 200 having a light emitter 210 and a waveform generator 230 configured in accordance with an embodiment of the present technology. The light emitter 210 includes a semiconductor structure 212, a first electrode 213, and a second electrode 215. The semiconductor structure 212 includes a bulk semiconductor material 216 ("bulk material 216"), an optional spacer 217, and an active region 218 between the bulk material 216 and the spacer 217. The bulk material 216 can include, for example, a single grain semiconductor material (e.g., N-type AlGaN) with a thickness greater than about 10 nanometers and up to about 500 nanometers. The spacer 217 can include, for example, a single grain semiconductor material (e.g., GaN or AlGaN). The active region 218 can include a single quantum well ("SQW") or multiple quantum wells "MQWs." In one embodiment, the active region 218 includes a single grain semiconductor material (e.g., GaN or AlGaN) with a thickness in the range of about 1 nanometer to 10 nanometers. In another embodiment, the active region 218 includes a semiconductor stack of such materials.

The first electrode 213 includes a first conductive contact 219a connected to the bulk material 216. The second electrode 215 includes a second conductive contact 219b and a dielectric material 220 between the second conductive contact 219b and the spacer 217. The conductive contacts 219 can include, for example, a metal, a metal alloy, a doped silicon, and/or other electrically conductive substrate materials. The dielectric material 220 can include, for example, silicon oxide ($SiO_2$), silicon nitride ($Si_3N_4$), and/or other suitable non-conductive materials formed on the semiconductor structure 212 via thermal oxidation, chemical vapor deposition ("CVD"), atomic layer deposition ("ALD"), and/or other suitable techniques. In other embodiments, the dielectric material 220 can include a polymer (e.g., polytetrafluoroethylene and/or other fluoropolymer of tetrafluoroethylene), an epoxy, and/or other polymeric materials.

The waveform generator 230 is configured to output a bias signal. In the illustrated embodiments, the waveform generator 230 produces a square wave having a first voltage $V_1$ and a second voltage $V_2$. In other embodiments, however, the waveform generator 230 can output other types of waveforms having various pulse shapes, frequencies, voltages, current, power, etc. Because the basic structures and functions of waveform generators are known, they have not been shown or described in further detail to avoid unnecessarily obscuring the described embodiments.

In operation, the light emitter 210 functions similar to a capacitor (e.g., a metal-oxide-semiconductor (MOS) capacitor). The waveform generator 230 applies the first voltages $V_1$ to reverse bias the light emitter 210, and it applies the second voltage $V_2$ to forward bias the light emitter 210. As described in greater detail below, the reverse bias stores charge in the light emitter 210 and the forward bias releases the charge to emit light. In one embodiment, the light emitter 210 emits UV light (having wavelengths, e.g., in the range of 10 nm to 400 nm). In another embodiment, the light emitter 210 employs AlGaN materials, but not P-type AlGaN materials, to produce the UV light. As such, the light emitter 210 can have a larger conductivity and higher light extraction efficiency than conventional UV light emitters.

For purposes of clarity, only certain components of the SST system 200 have been shown in the illustrated embodiments. However, SST systems configured in accordance with various embodiments of the present technology can include other components. For example, in some embodiments the SST system 200 can include a lens, a mirror, and/or other suitable optical and/or electrical components.

Figure 3A:
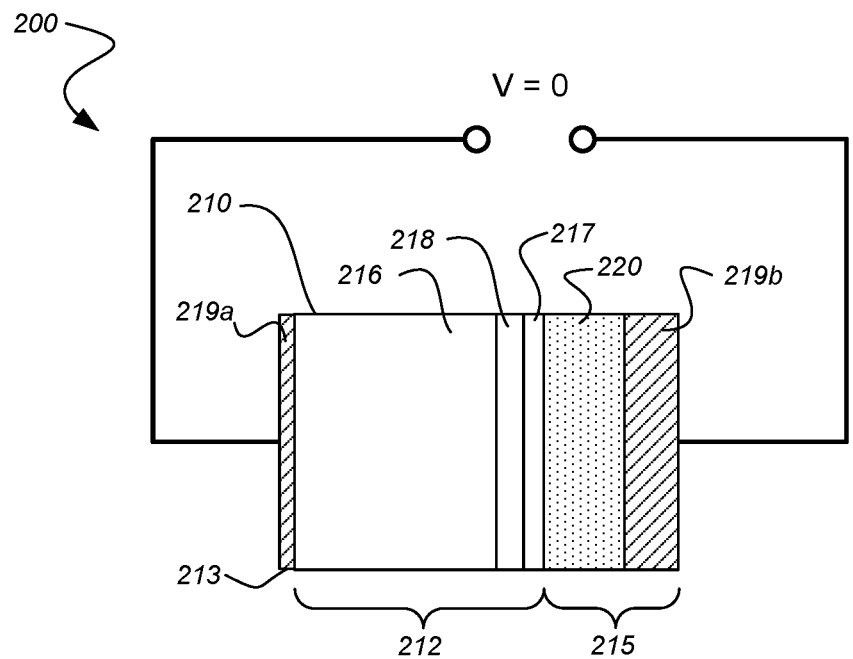
FIGS. 3A and 3B are a schematic cross-sectional diagram and an energy band diagram of the light emitter of FIG. 2 at equilibrium in accordance with an embodiment of the present technology.
Figure 3B:
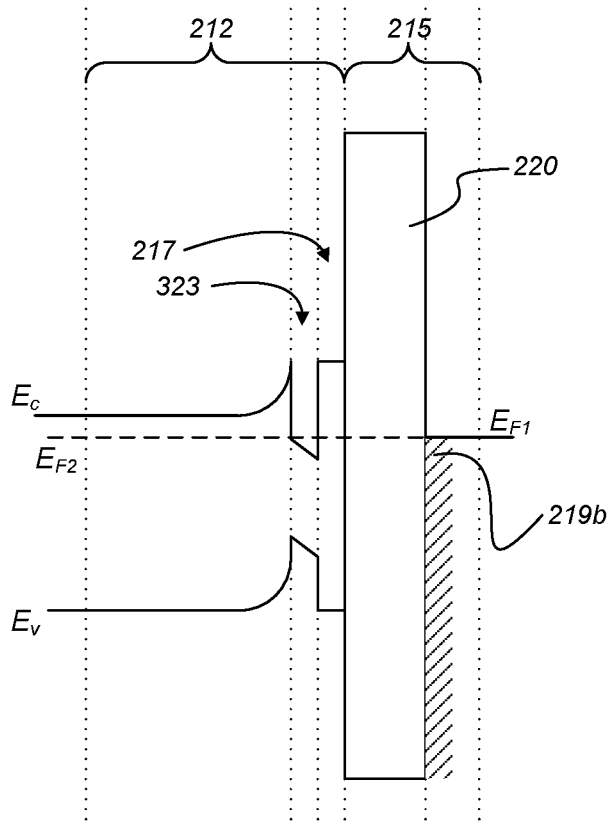

FIGS. 3A and 3B are a schematic cross-sectional diagram and an energy band diagram of the light emitter 210 at equilibrium. Referring to FIGS. 3A and 3B together, the second conductive contact 219b has a first Fermi level $E_{F1}$. The semiconductor structure 212 includes a valence band $E_v$, a conduction band $E_c$, and a second Fermi level $E_{F2}$ that is aligned with the first Fermi level $E_{F1}$. The semiconductor structure 212 also includes a quantum well 323 having available charge carrier (i.e., hole) energy states above the valence band $E_v$ and available charge carrier (i.e., electron) energy states below the conduction band $E_c$. As shown, the valence and conduction bands $E_v$ and $E_c$ bend upwards at the left-hand side of the quantum well 323, but they are generally flat within the region of the spacer 217. In some embodiments, the spacer 217 can include an intrinsic or lightly N-type doped material to reduce or eliminate interfacial states (i.e., defect states) between the quantum well 323 and the dielectric material 220. As such, the spacer 217 can directly contact the active region 218 (i.e., without a semiconductor material between the spacer 217 and the active region 218. In other embodiments, however, the spacer 217 can be absent from the light emitter 210.

Figure 4A:
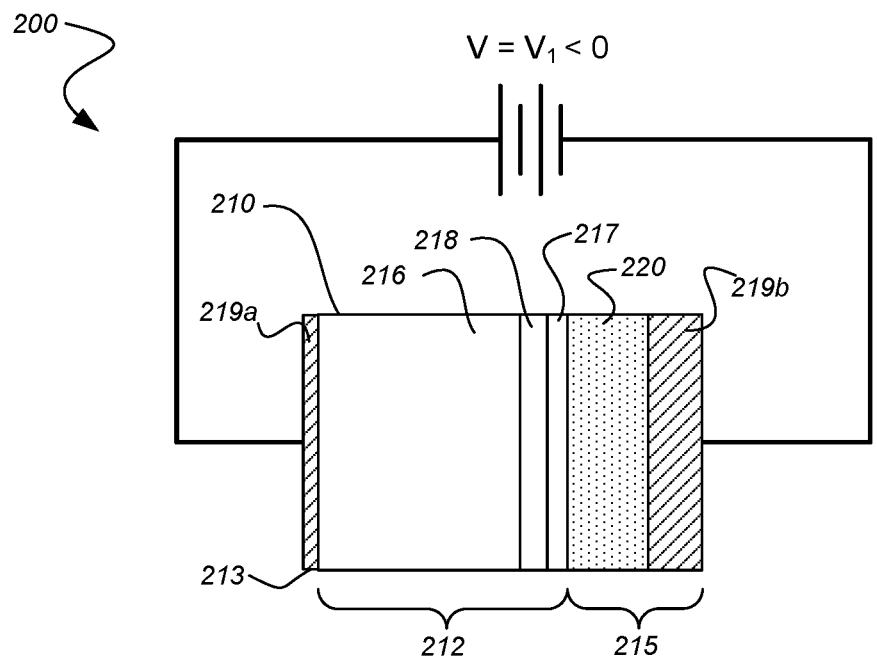
FIGS. 4A and 4B are a schematic cross-sectional diagram and an energy band diagram of the light emitter of FIG. 2 under reverse bias in accordance with an embodiment of the present technology.
Figure 4B:
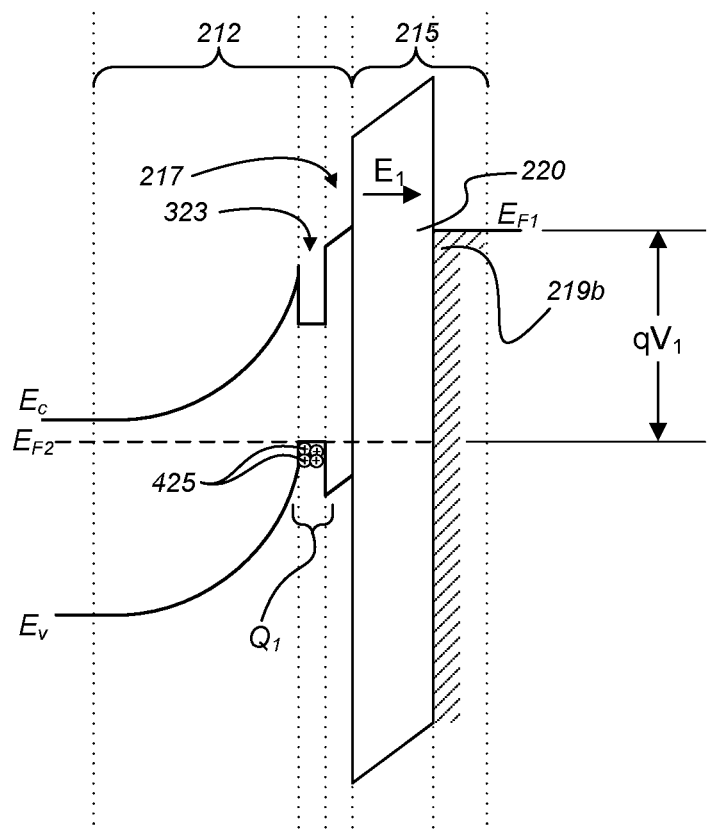

FIGS. 4A and 4B are a schematic cross-sectional diagram and an energy band diagram of the light emitter 210 under reverse bias. Referring to FIGS. 4A and 4B together, the first voltage $V_1$ raises the first Fermi level $E_{F1}$ above the second Fermi level $E_{F2}$ to bring the active region 218 into inversion. As shown, the first voltage $V_1$ produces a first electric field $E_1$ across the dielectric material 220 that depletes electrons from the active region 218. The electric field $E_1$ also draws holes 425 from the bulk material 216 into the active region 218. The quantum well 323 traps the holes 425 and accumulates an electrical charge $Q_1$ ("accumulated charge $Q_1$"). In general, the accumulated charge $Q_1$ can be based on factors such as the magnitude of the first voltage $V_1$, a pulse width of the first voltage $V_1$, the number of quantum wells at the active region 218, the resistivity of the semiconductor structure 212, etc. As described in greater detail below, under a reverse bias, the accumulated charge $Q_1$ increases as a function of time to a maximum charge level $Q_{Max}$.

Figure 5A:
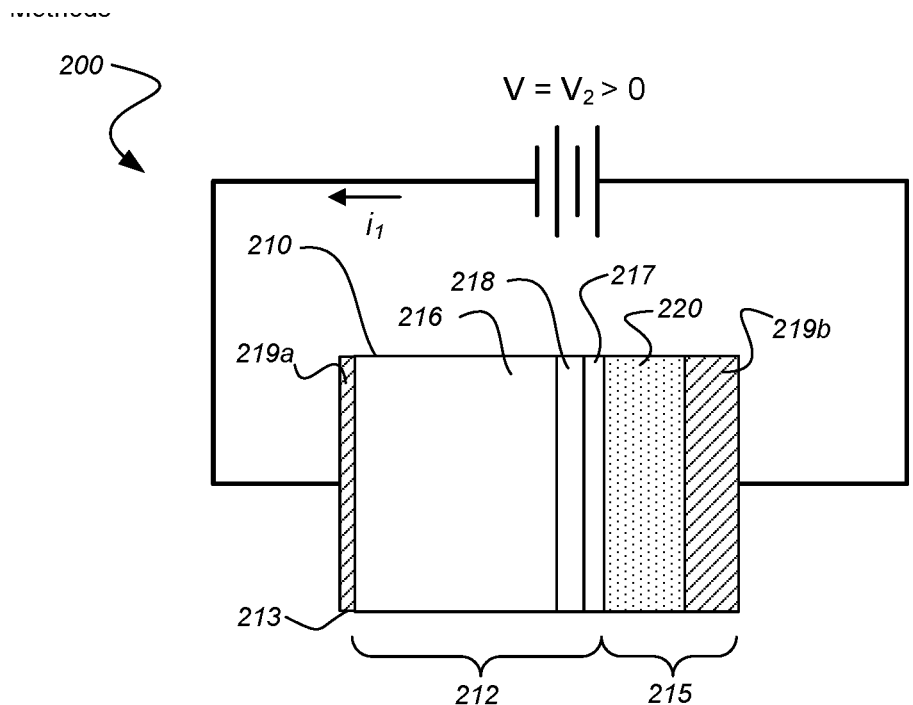
FIGS. 5A and 5B are a schematic cross-sectional diagram and an energy band diagram of the light emitter of FIG. 2 under forward bias in accordance with an embodiment of the present technology.
Figure 5B:
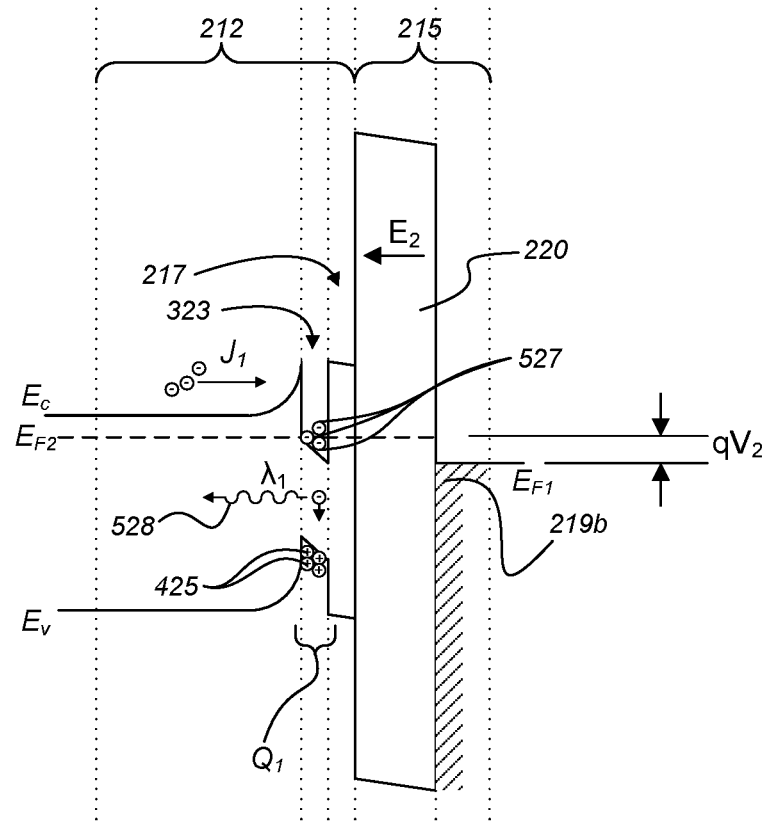

FIGS. 5A and 5B are a schematic cross-sectional diagram and an energy band diagram of the light emitter 210 under forward bias. Referring to FIGS. 5A and 5B together, the second voltage $V_2$ lowers the first Fermi level $E_{F1}$ below the second Fermi level $E_{F2}$ to bring the active region into accumulation. The second voltage $V_2$ produces a second electric field $E_2$ in the dielectric material 220 that draws electrons 527 from the bulk material 216 into the active region 218. When the electrons 527 recombine with the holes 425 in the quantum well 323, they emit light 528 (e.g., UV light). Also, the electrons 527 that flow through the bulk material 216 produce a discharge current $i_1$ that eventually depletes (e.g., partially or fully depletes) the accumulated charge $Q_1$. As described in greater detail below, under a forward bias, the accumulated charge $Q_1$ decreases as a function of time to a minimum charge level $Q_{Min}$.

Figure 6:
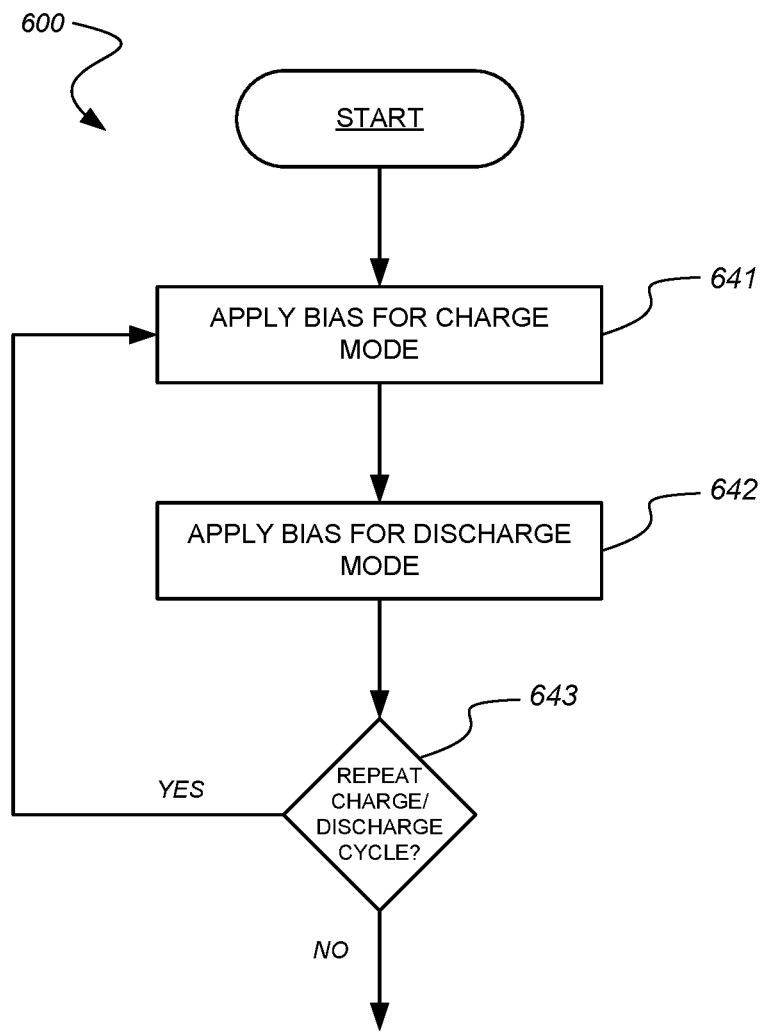
FIG. 6 is a flow diagram illustrating a method for operating the light emitter of FIG. 2 in accordance with an embodiment of the present technology.

FIG. 6 is a flow diagram illustrating a method 600 for operating the light emitter 210 in accordance with an embodiment of the present technology. In one aspect of the embodiment of FIG. 6, the method 600 is a carried out by the waveform generator 230 (FIG. 2). The method 600 begins after a start block. For example, the method 600 can start after powering on the SST system 200. At block 641, the waveform generator 230 charges the light emitter 210 in a "charge mode." In this mode, the waveform generator 230 can apply a first phase of a bias signal to the light emitter 210. The first phase can include a first waveform that reverse biases the active region 218 (FIG. 2). For example, a portion of the first waveform can have a signal level at the first voltage $V_1$. As described in greater detail below, the charge mode has an elapsed charge time $\Delta t_C$ ("charge time $\Delta t_C$").

At block 642, the waveform generator 230 discharges the light emitter 210 in a "discharge mode." In this mode, the waveform generator 230 can apply a second phase of the bias signal to the light emitter 210. The second phase can include a second waveform that forward biases the active region 218. For example, a portion of the second waveform can have a signal level at the second voltage $V_2$. As described in greater detail below, the discharge mode has an elapsed discharge time $\Delta t_D$ ("discharge time $\Delta t_D$").

At decision block 643, the waveform generator 230 completes a charge/discharge cycle, and it can return to block 641 to carry out another charge/discharge cycle. In several embodiments, the frequency of the charge/discharge cycle can be based on the charge time $\Delta t_C$ and the discharge time $\Delta t_D$, as shown by Equation 1.

$$f_1 = 1/(\Delta t_C + \Delta t_D) \quad (1)$$

Figure 7A:
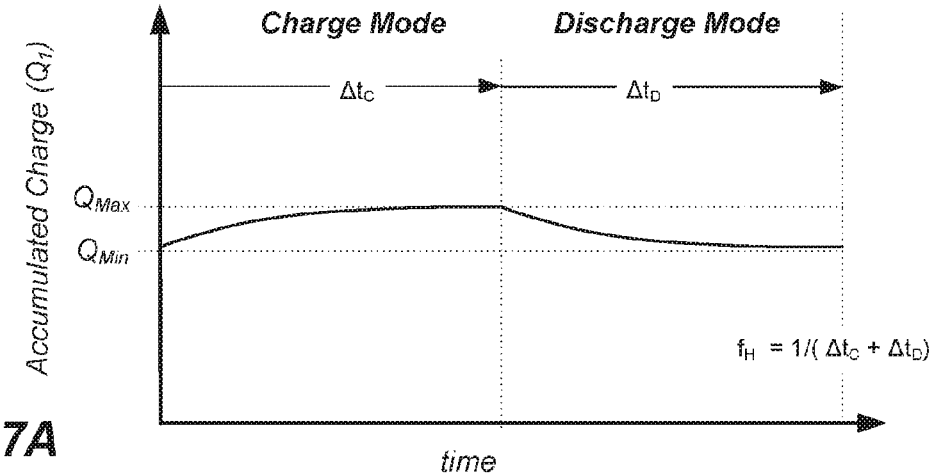
FIGS. 7A-7C show accumulated charge, discharge current, and photon flux, over a high frequency charge/discharge cycle of the light emitter of FIG. 2 in accordance with an embodiment of the present technology.
Figure 7B:
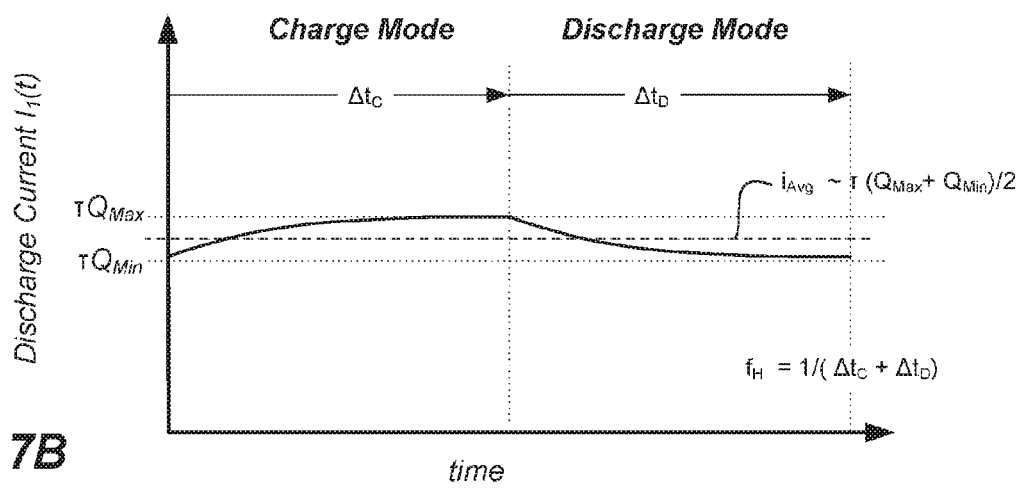
Figure 7C:
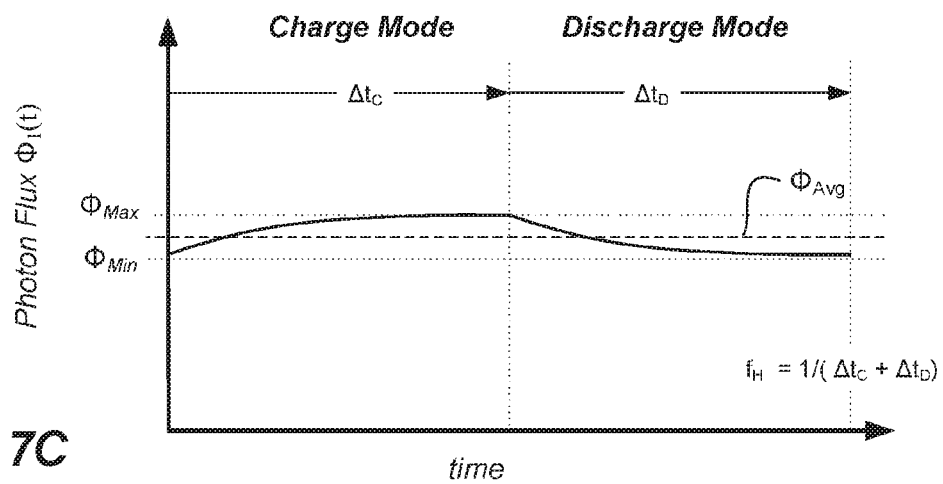

FIGS. 7A-7C show accumulated charge (FIG. 7A), discharge current (FIG. 7B), and photon flux (FIG. 7C) over a high frequency $f_H$ charge/discharge cycle of the light emitter 210 in accordance with an embodiment of the present technology. Without being bound by theory, it is believed that the charge and discharge modes function in a manner somewhat analogous to a MOS capacitor. However, unlike a conventional MOS capacitor, the discharge mode also emits electromagnetic radiation (e.g., UV light) from the capacitor.

FIG. 7A shows the accumulated charge $Q_1$ as a function of time over the high frequency $f_H$ charge/discharge cycle. In charge mode, the accumulated charge $Q_1(t)$ increases from the minimum charge level $Q_{Min}$ to the maximum charge level $Q_{Max}$ over the charge time $\Delta t_C$. In the discharge mode, the accumulated charge $Q_1(t)$ decreases from the maximum charge level $Q_{Max}$ to the minimum charge level $Q_{Min}$ over the discharge time $\Delta t_D$.

FIG. 7B shows the discharge current $i_1(t)$ as a function of time over the high frequency $f_H$ charge/discharge cycle. Without being bound by theory, it is believed that the discharge current $i_1(t)$ is proportional to the recombination rate $\tau$ of electron in the active region 218 (FIG. 2). Also, because the cycle frequency is high, it is believed that in the charge mode, the electrons in the active region do not completely dissipate. Accordingly, for small differences in the maximum and minimum accumulated charge, the discharge current $I_1$ can be approximated, as shown by Equation 2.

$$I_{AVG} \sim \tau(Q_{Max}+Q_{Min})/2 \quad (2)$$

FIG. 7C shows photon flux $\Phi_1(t)$ of emitted light (e.g., the light 528 of FIG. 5) as a function of time over the high frequency $f_H$ charge/discharge cycle. Without being bound by theory, it is believed that the average photon flux $\Phi_1$ is proportional to the discharge current $I_1(t)$. Accordingly, based on Equation 2 the average photon flux $\Phi_1$ can be approximated, as shown by Equation 3.

$$\Phi_{AVG} \propto \tau(Q_{Max}+Q_{Min})/2 \quad (3)$$

Figure 8A:
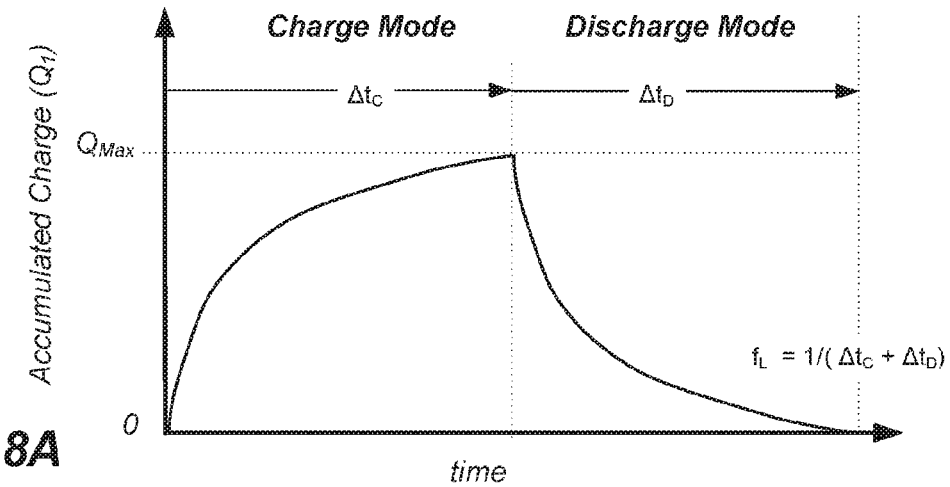
FIGS. 8A-8C show charge accumulation, current discharge, and photon flux, over a low frequency charge/discharge cycle of the light emitter of FIG. 2 in accordance with an embodiment of the present technology.
Figure 8B:
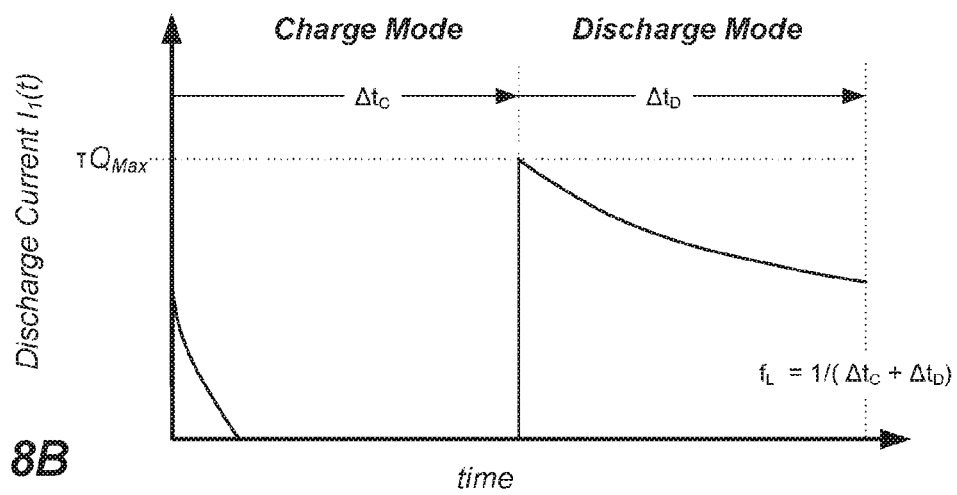
Figure 8C:
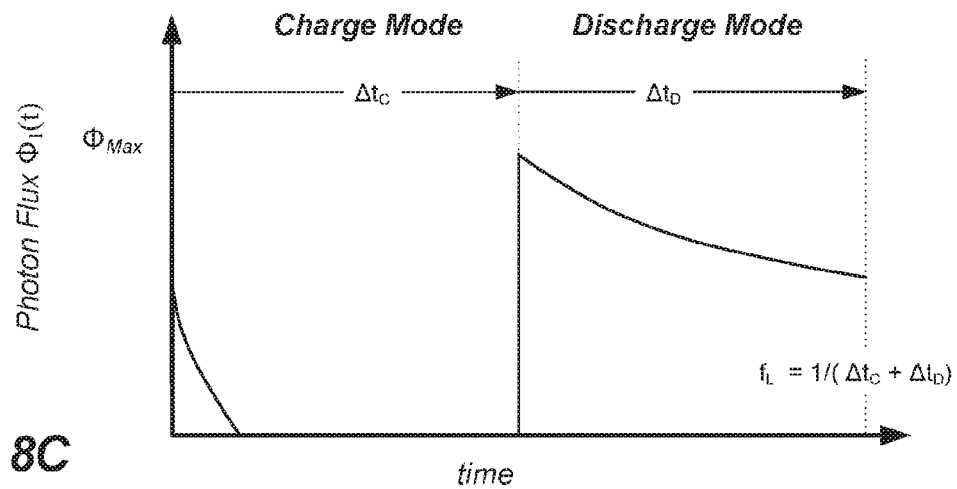

FIGS. 8A-8C show accumulated charge (FIG. 8A), discharge current (FIG. 8B), and photon flux (FIG. 8C) over a low frequency $f_L$ charge/discharge cycle of the light emitter 210 in accordance with an embodiment of the present technology. In one respect, FIGS. 8A-8C are different from FIGS. 7A-7C in that $\Delta t_C(f_L) > \Delta t_C(f_H)$ and $\Delta t_D(f_L) > \Delta t_D(f_H)$.

FIG. 8A shows the accumulated charge $Q_1$ as a function of time over the low frequency $f_L$ charge/discharge cycle. In charge mode, the accumulated charge $Q_1(t)$ increases from zero charge to the maximum charge level $Q_{Max}$ over the charge time $\Delta t_C$. In the discharge mode, the accumulated charge $Q_1(t)$ decreases from the maximum charge level $Q_{Max}$ to zero charge over the discharge charge time $\Delta t_D$. Without being bound by theory (and similar to high/low frequency behavior of a MOS capacitor), it is believed that the maximum accumulated charge at low frequency $Q_{Max}(f_L)$ is greater than the maximum accumulated charge at high frequency $Q_{Max}(f_H)$.

FIG. 8B shows the discharge current $i_1(t)$ as a function of time over the low frequency $f_L$ charge/discharge cycle. Without being bound by theory, it is believed that because the cycle frequency $f_L$ is low frequency, the electrons in the active region dissipate during charge mode. As such, the discharge current $i_1(t)$ ceases to flow over the majority of the charge time $\Delta t_C$. Similar to FIG. 7B, it is believed that during the discharge mode, current $i_1(t)$ is proportional to the recombination rate $\tau$ of electron in the active region 218 (FIG. 2).

FIG. 8C shows photon flux $\Phi_1(t)$ of emitted light (e.g., the light 528 of FIG. 5) as a function of time over the low frequency $f_L$ charge/discharge cycle. Without being bound by theory, it is believed that the maximum photon flux at low frequency $\Phi_{MAX}(f_L)$ is greater than the maximum photon flux at high frequency $\Phi_{MAX}(f_H)$. In particular, it is believed that this is due to larger amount of accumulated charge at the low frequency charge mode (FIG. 8A). In some embodiments, it is believed that the low cycling frequency $f_L$ can emit pulsed light. For example, during the charge mode, the discharge current can reduce to zero, such that the light emitter 210 does not output photons for a portion of the charge time $\Delta t_C$. Accordingly, by appropriate selection of the duty cycle, it is believed that emitted light can be shaped to have variously pulses widths.

Figure 9:
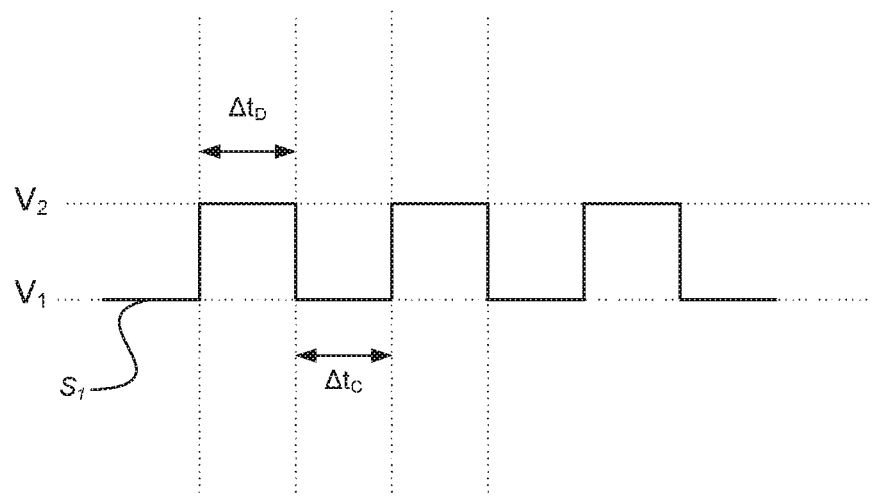
FIG. 9 is a signal line diagram showing a bias signal configured to have a duty cycle for operating the light emitter of FIG. 2 in accordance with an embodiment of the present technology.

FIG. 9 is a signal line diagram showing a bias signal $S_1$ configured to have a duty cycle for operating the light emitter 210 in accordance with an embodiment of the present technology. The charge mode of the bias signal $S_1$ has a charge-mode duty cycle that can be represented by Equation 4 and a discharge-mode duty cycle that can be represented by Equation 5.

$$\text{Duty Cycle (Charge mode)}=\Delta t_C/(\Delta t_C+\Delta t_D) \quad (4)$$

$$\text{Duty Cycle (Discharge mode)}=\Delta t_D/(\Delta t_C+\Delta t_D) \quad (5)$$

In the illustrated embodiments, the duty cycle of the charge and discharge modes is 50%. In other embodiments, however, the duty cycle can be configured differently. For example, if the recombination rate $\tau$ limits the rate of discharge, the duty cycle of the charge mode can be reduced (e.g., to 25%) to reduce the charge time. As such, the duty cycled of the discharge mode will increase (e.g., to 75%) to allow more time for discharge. In one embodiment, the duty cycle can be selected to provide pulsed light. In another embodiment, the duty cycle can be selected to provide non-pulsed light. In certain embodiments, the bias signal $S_1$ can be configured to have other features, such as leading and/or falling edges that are sloped, a time-varying duty cycle, multiple voltage levels, sinusoidal waveforms, etc. For example, the bias signal $S_1$ can include a first phase to initially charge (e.g., ramp up) the light emitter 210 and a second phase to operate the light emitter 210 at steady state (i.e., a steady state of pulsed light or non-pulsed light).

Figure 10:
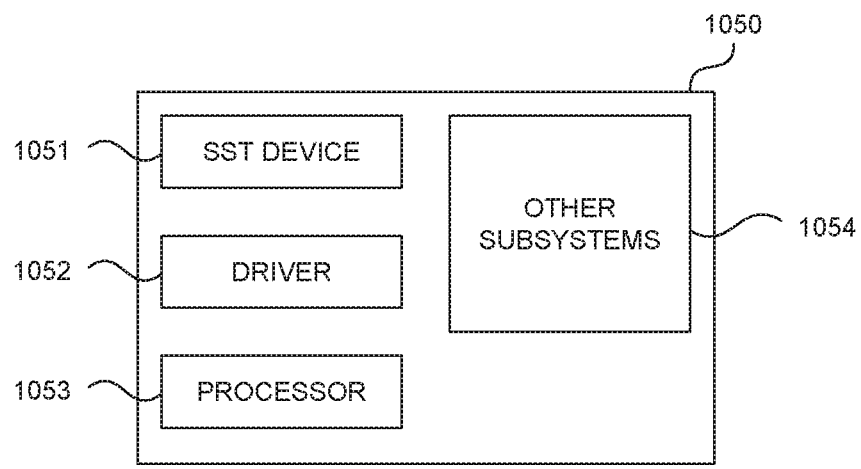
FIG. 10 is a schematic view of a system that includes a light emitter configured in accordance with selected embodiments of the present technology.

The light emitter 210 and/or the SST system 200 described above with reference to FIGS. 2-9 can be used to form SST devices, SST structures, and/or other semiconductor structures that are incorporated into any of a myriad of larger and/or more complex devices or systems, a representative example of which is system 1050 shown schematically in FIG. 10. The system 1050 can include one or more semiconductor/SST devices 1051, a driver 1052, a processor 1053, and/or other subsystems or components 1054. The resulting system 1050 can perform any of a wide variety of functions, such as backlighting, general illumination, power generations, sensors, and/or other suitable functions. Accordingly, representative systems can include, without limitation, hand-held devices (e.g., mobile phones, tablets, digital readers, and digital audio players), lasers, photovoltaic cells, remote controls, computers, and appliances. Components of the system 1050 may be housed in a single unit or distributed over multiple, interconnected units (e.g., through a communications network). The components of the system 1050 can also include local and/or remote memory storage devices, and any of a wide variety of computer readable media.

From the foregoing, it will be appreciated that specific embodiments of the disclosure have been described herein for purposes of illustration, but that various modifications may be made without deviating from the disclosure. For example, in some embodiments, the maximum and/or minimum accumulated charge can be configured based on material properties, in addition to or in lieu of the cycle frequency and/or the bias level. These material properties can include, for example, conductivity, carrier mobility, carrier effective mass, impurity concentration, etc. Also, the various waveforms shown in the Figures can have different slopes, magnitudes, shapes, etc. Similarly, the semiconductor devices, substrates, and other features can have shapes, sizes, and/or other characteristics different than those shown and described with reference to the Figures. For example, the conductive contacts 219 of the light emitter 210 can have different configurations (e.g., lateral or vertical configurations). In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. For example, in some embodiments, light emitters can be configured to work with P-type materials. Accordingly, the disclosure and associated technology can encompass other embodiments not expressly shown or described herein.

We claim:

1. A light emitter device, comprising:
  a semiconductor structure including a first semiconductor material and a second semiconductor material, wherein the second semiconductor material includes an active region having a bandgap configured to emit light; and
  an electrode operably coupled to the second semiconductor material, wherein the electrode includes a conductive contact and a dielectric material between the active region and the conductive contact, wherein the electrode is configured to—accumulate charge in the active region, and
    draw a discharge current through the first semiconductor material to discharge at least a portion of the accumulated charge.

2. The light emitter of claim 1 wherein the first semiconductor material includes an N-type semiconductor material, and wherein the second semiconductor materially operably couples the first semiconductor material to the electrode without an intermediary P-type material.

3. The light emitter of claim 2 wherein the bandgap is configured to separate charge carriers by one or more energy levels in the ultraviolet spectrum.

4. The light emitter of claim 2 wherein the electrode and at least a portion of the second semiconductor material define a capacitor structure.

5. The light emitter of claim 1 wherein the active region includes at least one quantum well.

6. The light emitter of claim 1, further comprising a spacer between the second semiconductor material and the electrode.

7. The light emitter of claim 1 wherein:
  the conductive contact is a first conductive contact;
  the light emitter further comprises a second conductive contact connected to the first semiconductor material; and
  the dielectric material prevents current flow between the first and second contacts.

8. An ultraviolet (UV) light emitter device, comprising:
  a metal-oxide-semiconductor (MOS) capacitor;
  an active region operably coupled to the MOS capacitor, wherein the active region includes at least one quantum well configured to store first charge carriers under a first bias;
  a spacer material between the MOS capacitor and the active region; and
  a bulk semiconductor material operably coupled to the active region, wherein the bulk semiconductor material is configured to provide second charge carriers to the active region such that the active region emits UV light.

9. The UV light emitter of claim 8 wherein:
  the active region includes at least one of gallium nitride (GaN) or aluminum GaN (AlGaN); and
  the bulk semiconductor material includes N-type AlGaN, wherein the active region and the bulk semiconductor material do not include P-type GaN nor P-type AlGaN.

10. The UV light emitter of claim 8 wherein the spacer material includes at least one of gallium nitride (GaN) or aluminum GaN (AlGaN), but not P-type GaN nor P-type AlGaN.

11. The UV light emitter of claim 8 wherein:
  the spacer material includes at least one of gallium nitride (GaN) or aluminum GaN;
  the active region includes at least one of GaN or AlGaN; and
  the bulk semiconductor material includes N-type AlGaN, wherein the spacer material, the active region, and the bulk semiconductor material do not include P-type GaN nor P-type AlGaN.

12. The UV light emitter of claim 8 wherein the active region directly contacts the spacer.

13. A method for producing ultraviolet (UV) light, comprising:
  biasing a metal-oxide (MOS) capacitor with at least a first voltage, wherein the MOS capacitor is operably coupled to an active region having energy bands configured for emitting UV light; and
  biasing the MOS capacitor with at least a second voltage to emit the UV light from the active region.

14. The method of claim 13 wherein:
  biasing the MOS capacitor with the first voltage further comprises applying the first voltage for a first duration of time to charge the MOS capacitor; and
  biasing the MOS capacitor with the second voltage further comprises applying the second voltage for a second duration of time to discharge the MOS capacitor.

15. The method of claim 13 wherein biasing the MOS capacitor with the second voltage further comprises applying the second voltage for the second duration of time to partially discharge the MOS capacitor.

16. The method of claim 13 wherein biasing the MOS capacitor with the second voltage further comprises applying the second voltage for the second duration of time to completely discharge the MOS capacitor.

17. The method of claim 13, further comprising generating a bias signal, wherein the bias signal includes the first voltage and the second voltage, and wherein the bias signal has a duty cycle configured to pulse the UV light.

18. The method of claim 13, further comprising generating a bias signal, wherein the bias signal includes the first voltage and the second voltage, and wherein the bias signal has a duty cycle configured to output the UV light such that it is generally non-pulsed.

* * * * *